(12) United States Patent
Stumpf et al.

(10) Patent No.: US 12,313,719 B2
(45) Date of Patent: May 27, 2025

(54) POWER SENSOR ARRANGEMENT FOR ON-WAFER POWER CALIBRATION

(71) Applicant: Rohde & Schwarz GmbH & Co. KG, Munich (DE)

(72) Inventors: Christopher Stumpf, Munich (DE); Daniel Mueller-Remer, Guenzburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 181 days.

(21) Appl. No.: 18/448,411

(22) Filed: Aug. 11, 2023

(65) Prior Publication Data

US 2025/0052845 A1    Feb. 13, 2025

(51) Int. Cl.
*G01R 35/00* (2006.01)
*G01R 1/067* (2006.01)
*G01R 21/133* (2006.01)

(52) U.S. Cl.
CPC ........... *G01R 35/005* (2013.01); *G01R 1/067* (2013.01); *G01R 21/133* (2013.01)

(58) Field of Classification Search
CPC .... G01R 35/005; G01R 1/067; G01R 21/133; G01R 31/3025
USPC ........ 324/754.03, 754.01, 537, 500
See application file for complete search history.

(56) References Cited

U.S. PATENT DOCUMENTS 10,180,458 B2   1/2019  Perndl
10,371,716 B2 *  8/2019  Lee .................. G01R 31/2834
10,574,367 B2   2/2020  Dominizi et al.
2024/0125881 A1 *  4/2024  Riedmann ............ G01R 35/007
2024/0230718 A9 *  7/2024  Paver .................... G01R 35/005

OTHER PUBLICATIONS

Lin, Wei-Hwa et al., A New Self-Powered Wireless Sensing Circuitry for On-Wafer In-Situ EUV Detection, 2022 IEEE International Electron Devices Meeting (IEDM), 2022, pp. 743-746.
Zagorodny, Andrey et al., 0.01-50 GHz Power Detector MMICs, 2015 IEEE, 2015, pp. 1-4.
Goff, Miles E. et al., DC to 40 GHz MMIC Power Sensor, 1990 IEEE, 1990, pp. 105-108.

* cited by examiner

*Primary Examiner* — Giovanni Astacio-Oquendo
(74) *Attorney, Agent, or Firm* — Studebaker Brackett PLLC (57) ABSTRACT

The present disclosure relates to a power sensor arrangement for on-wafer power calibration including a power sensor(s). The power sensor(s) include: a first connection surface which is arranged to receive a probe tip of a probing device; a power measurement cell which is electrically connected to the first connection surface, wherein the power measurement cell is configured to measure a power level of an RF signal applied to the first connection surface; an analog-to-digital converter (ADC) which is configured to digitalize an output signal of the power measurement cell to generate a digitalized data stream; and an encoding unit configured to encode the digitalized data stream. The encoding unit is configured to output the encoded data stream to: the first connection surface, a second connection surface of the power sensor(s), or an antenna unit of the power sensor arrangement for forwarding the encoded data stream.

17 Claims, 7 Drawing Sheets

POWER SENSOR ARRANGEMENT FOR ON-WAFER POWER CALIBRATION

TECHNICAL FIELD

The disclosure relates to a power sensor arrangement for on-wafer power calibration and to a system comprising such a power sensor arrangement.

BACKGROUND ART

A wafer prober is a device that tests chips on a wafer by measuring them individually before they are singulated. Only chips which were found to be functional are encased in a further step, while non-functional chips can be discarded. A typical wafer prober has an on-wafer probe, e.g. in the form of fine needles, to contact the chips on the wafer. Such a wafer prober needs to be calibrated in regular time intervals.

This calibration can be carried out by a number of calibration measurements. Thereby, the wafer prober can be connected to a vector network analyzer (VNA). For carrying out a power calibration measurement, a connection between the VNA and an on-wafer probe of the wafer prober is typically opened to connect an additional power sensor and/or a phase reference (e.g., coaxial or waveguide sensors). However, this opening of the connection is undesirable and may introduce calibration and/or measurement errors.

For instance, a coupler in the path between the VNA and the on-wafer probe can be used to couple in/out a calibration signal for the power sensor/phase reference. However, this typically adds a significant loss in the signal path. Furthermore, this concept does not allow for auto-matic extraction of the embedding/deembedding files. Hereby, embedding/deembedding refers to the modelling and mathematical removal of the influence of test fixtures, probes and other elements, which connect the test setup with a chip to be tested (i.e., a device-under-test).

A calibration of a wafer prober can also be carried out by means of a calibration substrate. When conducting a calibration measurement, a user can swap a wafer to be measured with the calibration substrate. For a power calibration, the calibration substrate is contacted by a probe that is connected to a standard power sensor. This approach has the disadvantage that the probe with the connected power sensor is bulky and difficult to place accurately in a standard on-wafer measurement. A further issue when using a calibration substrate is the transmission of measurement data back to the VNA. As the VNA can be quite far away from the calibration substrate, this can increase an effort in wiring of the setup.

SUMMARY

Thus, there is a need to provide an improved power sensor arrangement for on-wafer calibration which avoids the above-mentioned disadvantages.

These and other objectives are achieved by the embodiments provided in the enclosed independent claims. Advantageous implementations of the present disclosure are further defined in the dependent claims.

According to a first aspect, the disclosure relates to a power sensor arrangement for on-wafer power calibration. The power sensor arrangement comprises at least one power sensor which comprises: a first connection surface which is arranged to receive a probe tip of a probing device; a power measurement cell which is electrically connected to the first connection surface, wherein the power measurement cell is configured to measure a power level of an RF signal applied to the first connection surface; an analog-to-digital converter (ADC) which is configured to digitalize an output signal of the power measurement cell to generate a digitalized data stream; and an encoding unit configured to encode the digitalized data stream. The encoding unit is configured to output the encoded data stream to the first connection surface, or to a second connection surface of the at least one power sensor, or to an antenna unit of the power sensor arrangement for forwarding the encoded data stream.

This achieves the advantage that a power sensor arrangement for performing on-wafer power calibration measurements can be provided which has built-in data transmission capabilities. Due to the integrated ADC, the power sensor arrangement can achieve highly accurate calibration measurement results. Further, by outputting the encoded data stream via a connection surface of the power sensor or via the antenna unit, a cabling effort can be reduced. For instance, the data can be transmitted via probes (e.g., contacting needles) of the probing device, or it can be transmitted wirelessly. Thus, no extra cables are needed to feed the encoded data stream back to an (external) receiving unit.

The probing device can be connected to a measurement device, such as a VNA. The measurement device can provide the radio frequency (RF) signal, which can be a calibration signal. For instance, the probing device comprises an (on-wafer) probe which is connected to a test port of the VNA, e.g. via a cable. The probe tip can be a tip of this probe (e.g., a probing needle).

The encoded data stream which is output by the encoding unit (via a connection surface or a via the antenna array) can be received by the measurement device, e.g. by means of a receiving unit of the measurement device. This data can be used to perform a power calibration.

For instance, by means of the power calibration a difference between an expected (ideal) power applied at the probe tip and the actual power applied at the probe tip can be found. This allows to perform more accurate on-wafer power measurements with the probing device.

The power measurement cell can comprise the ADC, which can be configured to digitalize the measured power level of the applied RF signal. Further, the encoding unit can be a part of the ADC.

The RF signal can be a signal in a radio frequency or microwave range. The RF signal can be a (power) calibration signal.

For instance, the first connection surface receiving the probe tip means that it is arranged to be electrically connected by the probe tip.

For example, the power sensor arrangement comprises a substrate, wherein the at least one power sensor is arranged on the substrate. This substrate can be a calibration substrate. The calibration substrate can be located at an on-wafer probe station, e.g., on a chuck or on a chuck extension. The substrate can be a wafer or a part thereof.

The substrate can further comprise a number of calibration standards (e.g., open, short and match). These calibration standards can be contacted by the probe tip to carry out further calibration measurements, e.g., to calculate error terms for an S-parameter characterization of chips on a wafer.

In an implementation form of the first aspect, the power measurement cell comprises a diode, wherein the ADC is configured to measure a voltage at the diode.

In an implementation form of the first aspect, the diode is configured to transform the power level of the RF signal into a corresponding voltage signal, wherein the corresponding voltage signal is fed to the ADC.

In an implementation form of the first aspect, the at least one power sensor unit comprises: a bias tee which is configured to apply the encoded data stream to the first connection port and to electrically isolate or decouple the encoded data stream from the power measurement cell.

In an implementation form of the first aspect, the first connection surface is connected to the power measurement cell via a filter element.

The filter element can be a filter capacitor. For instance, the capacitance of the filter element can shield the (DC biased) encoded data stream from the power measurement cell.

In an implementation form of the first aspect, the first connection surface, the antenna unit or the second connection surface are configured to forward the encoded data stream to a receiving unit of a measurement device; wherein a communication between the at least one power sensor and the receiving unit is a bidirectional or an unidirectional communication.

The receiving unit can be integrated in a housing of the measurement device (e.g., a VNA housing) or can be a separate external device which is connected to the measurement device via a communication connected, e.g. via USB.

In an implementation form of the first aspect, the antenna unit is arranged on the same substrate as the at least one power sensor.

In an implementation form of the first aspect, the antenna unit comprises an antenna element and a transmitter, wherein the transmitter is configured to receive the encoded data stream and to forward the encoded data stream to the antenna element.

For instance, the transmitter can be configured to change a power level of the encoded data stream.

In an implementation form of the first aspect, the transmitter is configured to power the antenna element with less than 100 mW or with less than 10 mW.

The signal can be transmitted to the receiver unit wirelessly via the antenna unit. Thereby, the receiver unit is arranged within range of the antenna unit (e.g., spaced apart less than 10 m).

In an implementation form of the first aspect, the power measurement cell is powered by electrical energy received via the first connection surface. This achieves the advantage that no extra connection/cables for the power supply of the power measurement cell are required.

The electrical energy can be received via the RF signal which can be a power calibration signal (i.e., a part of the energy of the RF signal is used to power the power measurement cell). Alternatively, the electrical energy for powering the power measurement cell can be received via one or more DC connections of the probing device and/or the bias tee.

In an implementation form of the first aspect, the power sensor arrangement further comprises a plurality of the power sensors, wherein the plurality of the power sensors is arranged on the same substrate or on different substrates.

For instance, each of the power sensors has a built-in data transmission.

In an implementation form of the first aspect, only one of the plurality of the power sensors is usable at the same time.

According to a second aspect, the disclosure relates to a system comprising: the power sensor arrangement according to the first aspect of the disclosure; and a measurement device. The measurement device comprises: a signal source configured to generate the RF signal, and a receiving unit configured to receive the digitalized data stream from the power sensor arrangement. The system further comprises a chuck which is designed to accommodate the power sensor arrangement and/or a wafer with circuit structures to be tested, and the probing device, wherein the probing device is electrically connected to the signal source.

In an implementation form of the second aspect, the system is operable in a calibration mode during which the chuck is configured to move the power sensor arrangement to establish an electrical connection between at least one probe tip of the probing device and the first and/or the second connection surface of the at least one power sensor; and/or during which the receiving unit is configured to establish a wireless communication connection with the antenna unit of the power sensor arrangement.

In an implementation form of the second aspect, the system is operable in a measurement mode during which the chuck is configured to move the wafer to establish an electrical connection between the probe tip of the probing device and at least one circuit structure to be tested.

The measurement device can comprise a VNA for carrying out calibration measurements (e.g., providing the RF signal and/or receiving and further processing the encoded data stream).

The probing device can be a wafer prober or a part thereof. During measurement mode, the wafer prober can probe chips on a wafer to be tested, thereby using the results of the calibration measurements to correct for measurement errors. The wafer prober may further comprise or be connectable to the measurement device.

For instance, the chuck comprises a bearing surface for placing the wafer and a chuck extension for placing a substrate of the power sensor arrangement.

In an implementation form of the second aspect, in the measurement mode, the signal source is configured to adjust a power level of the generated RF signal based on data in the encoded data stream received at the receiving unit during calibration mode.

In an implementation form of the second aspect, in the measurement mode, the measurement device is configured to correct and/or adapt results of measurements of the circuit structures on the wafer based on data in the encoded data stream received at the receiving unit during calibration mode.

BRIEF DESCRIPTION OF THE DRAWINGS

The above described aspects and implementation forms of the present disclosure will be explained in the following description of specific embodiments in relation to the enclosed drawings, in which.

DETAILED DESCRIPTIONS OF EMBODIMENTS

Figure 1:
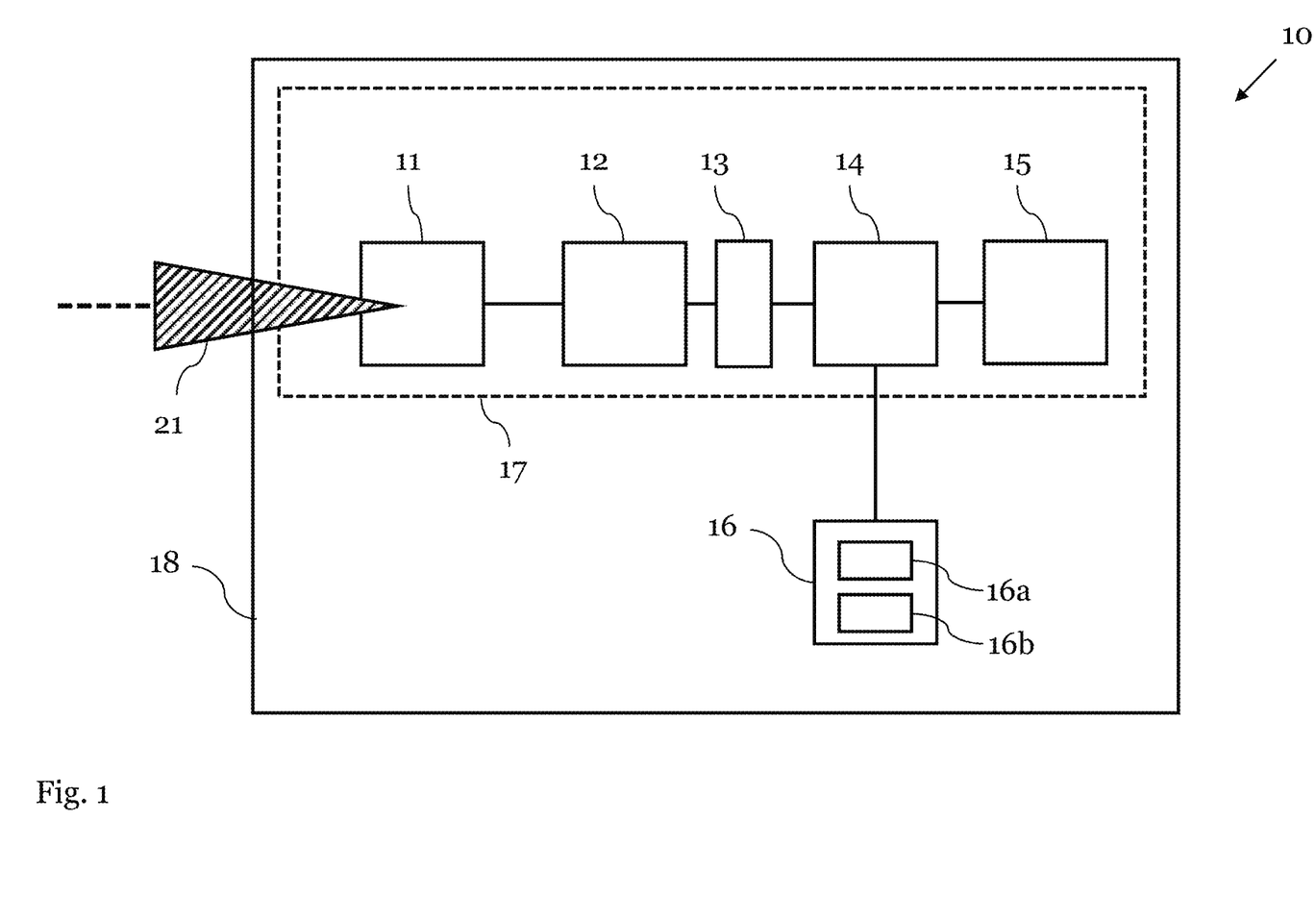
FIG. 1 shows a schematic diagram of a power sensor arrangement for on-wafer power calibration according to an embodiment.

FIG. 1 shows a schematic diagram of a power sensor arrangement for on-wafer power calibration according to an embodiment.

The power sensor arrangement 10 comprises: at least one power sensor 17 which comprises a first connection surface 11 which is arranged to receive a probe tip of a probing device 21; a power measurement cell 12 which is electrically connected to the first connection surface 11, wherein the power measurement cell 12 is configured to measure a power level of an RF signal applied to the first connection surface 11; an ADC 13 which is configured to digitalize an output signal of the power measurement cell 12 to generate a digitalized data stream; and an encoding unit 14 configured to encode the digitalized data stream.

The encoding unit 14 is configured to output the encoded data stream to at least one of the following elements:
a) the first connection surface 11,
b) an antenna unit 16 of the power sensor arrangement 10, or
c) a second connection surface 15 of the at least one power sensor 17, for forwarding the encoded data stream.

The power sensor arrangement 10 can comprise a substrate 18, wherein the at least one power sensor 17 is arranged on the substrate. This substrate can be a calibration substrate (e.g., a wafer or a part thereof). The antenna unit 16 can also be arranged on the substrate 18.

The integration of the ADC 13 in the power sensor 17 (also referred to as: power sensor unit 17) is advantageous, because this allows to achieve highly accurate calibration measurement results. The output of the measurement cell 12 (usually small power values) can be directly measured and digitalized by the ADC 13 on the calibration substrate.

The options a)-c) correspond to different ways of transmitting the encoded data stream, e.g., to a measurement device. Thereby, the existing connection surfaces on the substrate 18 can be used (options a and c) and, thus, no additional connections and signal lines are needed. The transmission of the encoded data stream can occur in a different frequency range than the RF signal frequency, to avoid unwanted signal interference. The use of an antenna (option b) also reduces the cabling efforts.

Due to this "built-in" transmission capabilities of the power sensor arrangement 10, no opening of the signal path between the measurement device and the probing device 21 is necessary. Furthermore, compared to a coupler solution, lower losses in the calibration path and, therefore, higher calibration quality can be achieved. Compared to a probe containing a connection for a standard power sensor, the power sensor arrangement 10 can be more compact and does not take more space or connection effort than a conventional on-wafer S-parameter calibration.

The RF signal can be a calibration signal which is applied to the first connection surface via the probing device 21. For calibration, the probing device 21 can be connected to a measurement device, such as a VNA. For example, the measurement device generates the RF signal and receives the encoded data stream from the power sensor arrangement 10.

The measurement device can calculate calibration data based on the encoded data stream. This calibration data can be used to correct and/or compensate measurement errors of a wafer prober. For instance, the probing device 21 can be a component of the wafer prober. The wafer prober may further comprise the measurement device or be connected to the measurement device.

The encoding unit 14 (also: encoder) can be configured to encode the output data of the ADC 13 to a desired data format which is suitable for wireless or wire-bound transmission to the receiver unit. The encoding unit 14 can be configured to transmit the encoded data stream in the form of a digital message according to a communication protocol (e.g., USB).

The encoding unit 14 can be configured to forward the encoded data stream to a receiving unit via the first or second connection surface 11, 15, or via the antenna unit 16. The receiving unit can be integrated in the measurement device or can be connected to the measurement device. The communication between the at least one power sensor 17 and the receiving unit can be a bidirectional or a unidirectional communication. The receiving unit or the measurement device can comprise a decoder for decoding the encoded data stream.

The antenna unit 16, which can be arranged on the substrate 18, may comprise an antenna element 16b (e.g., one or more antennas in an antenna array) and a transmitter 16a (or transmitter unit). The transmitter 16a can be configured to receive the encoded data stream and to forward the encoded data stream to the antenna element 16b.

The transmitter 16a can thereby adapt (e.g., enhance) a signal level of the encoded data stream. For instance, the transmitter can be configured to generate a transmission signal with a power between 10 mW and 100 mW.

The antenna unit 16 can be configured to communicate with the receiver unit via Blue-tooth or RFID (or another suitable wireless communication standard). Thus, in the example of using the antenna element 16 to forward the digital data stream, the encoding unit 14 can be configured to encode the digital data stream according to such a wireless communication protocol.

The second connection surface 15 can be contacted by another probe tip of the probing device 21 (e.g., another needle of the probing device). For instance, the second connection surface 15 can also be used for conducting transmission calibration measurements, wherein the measurement device (e.g., VNA) is connected to both connection surfaces 11, 15 via the respective probe tips of the probing device 21. Thus, when using the second connection surface 15 to transmit the encoded data stream, according to option c), the data stream can be forwarded via the second probe tip to the measurement device.

The first and/or second connection surface 11, 15 can be probe pads on a surface of the substrate 18. These probe pads can be arranged for being connected by a respective probe tip of the probing device 21.

The power sensor arrangement 10 can comprise a plurality of power sensors 17. The plurality of power sensors 17 can be arranged on the same substrate 18 or on different substrates. When conducting calibration measurements, all power sensors 17 of the power sensor arrangement 10 can be arranged on the same support surface, e.g. a chuck.

Each of the plurality of power sensors 17 can have built-in data transmission capabilities according to at least one of the options a)-c) above. For instance, each power sensor 17 can be connected to the antenna unit 16 or can comprise its own antenna unit.

For example, only one of the plurality of power sensors 17 is usable at the same time. The remaining power sensors 17 can be used as spares. For instance, after the first (and optional second) connection surface 11, 15 of a power sensor 17 is worn down after some time due to repeated connection with the probe tip, the next power sensor 17 can be used.

The power sensor arrangement 10, in particular the at least one power sensor 17, can form a power sensor ASIC (application-specific integrated circuit) on the substrate 18.

Figure 2A:
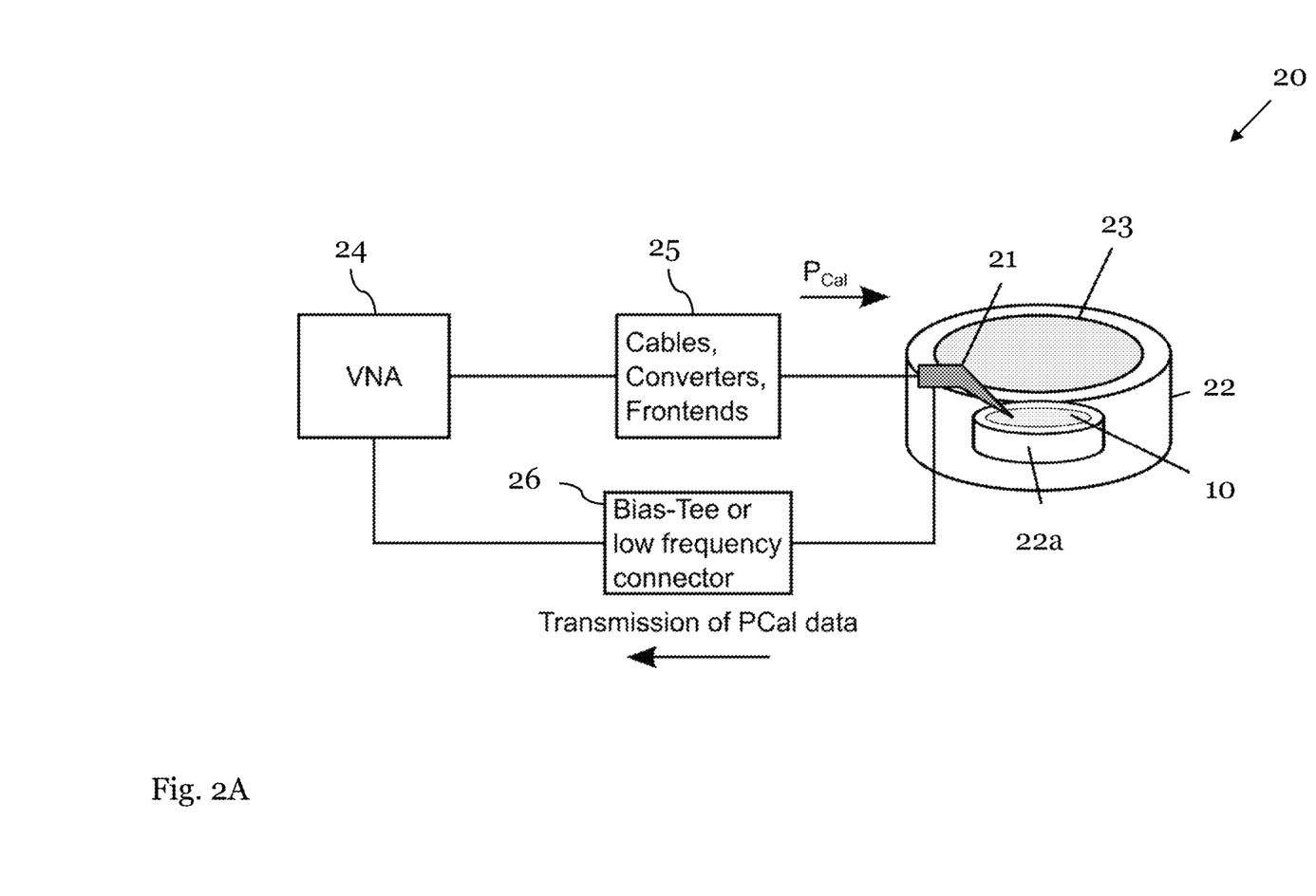
FIGS. 2A-2B show schematic diagrams of a system comprising a power sensor arrangement according to an embodiment.
Figure 2B:
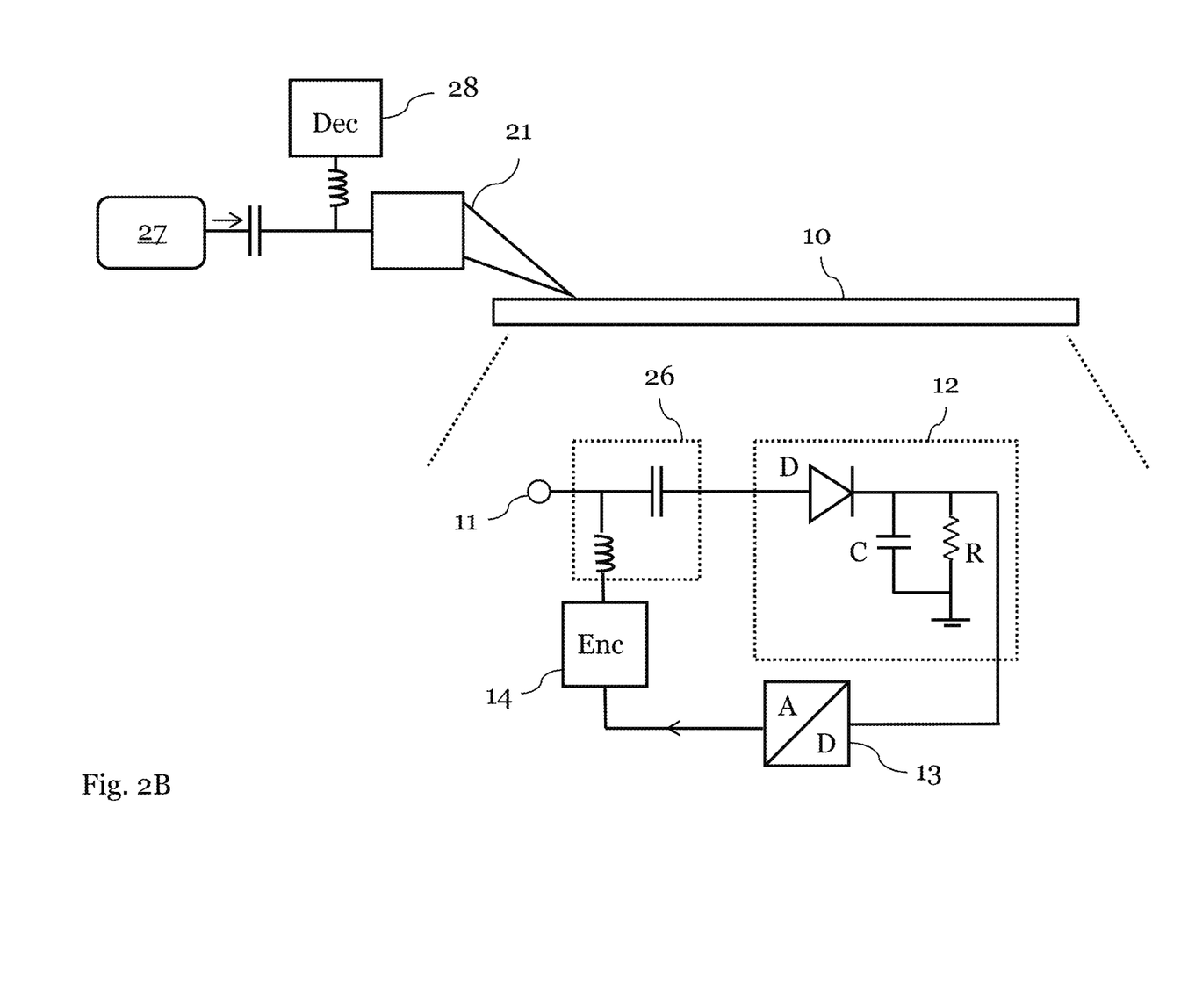

FIGS. 2A-2B show schematic diagrams of a system 20 comprising the power sensor arrangement 10 according to an embodiment. Thereby, FIG. 2A shows an overview of the system 20 and FIG. 2B shows an equivalent circuit diagram of the power sensor arrangement 10 used in the system 20.

Besides the power sensor arrangement 10, the system 20 comprises: a measurement device 24 which comprises: a signal source 27 configured to generate the RF signal (Pcai), and a receiving unit 28 configured to receive the digitalized data stream from the power sensor arrangement 10. The system 20 further comprises a chuck 22 which is design to accommodate the power sensor arrangement 10 and/or a wafer 23 with circuit structures to be tested, and the probing device 21 which is electrically connected to the signal source 27.

The power sensor arrangement 10, the measurement device 24, the chuck 22 and the probing device 21 can form a set of elements. The measurement device 24 can be a VNA or other suitable test and/or measurement device.

The power sensor arrangement 10 of the system 20 shown in FIGS. 2A-2B uses the first connection surface 11 to forward the encoded data stream (according to option a).

The system 20 can operate in a calibration mode, during which the chuck 22 is configured to move the power sensor arrangement 10 to establish an electrical connection between the probe tip of the probing device 21 and the first connection surface 11 of the at least one power sensor 17. In this configuration, the first connection surface 11 and the connected probe of the probing device 21 can form a low frequency signal path for transmitting the encoded data stream from the power sensor arrangement 10 (back) to the receiving unit 28.

The measurement device 24 and, in particular, the signal source 27, can be electrically connected to the probing device 21 via connection elements 25, such as cables, converters or front ends. For instance, deviations from an "ideal" power at the tip of the probing device 21 which are caused by these elements 25 can be determined during power calibration.

As shown in FIG. 2A and in the equivalent circuit diagram in FIG. 2B, the power sensor arrangement 10 can comprise a bias tee 26 or a diplexer. The bias tee 26 can be a component of the power sensor 17 and can be configured to apply the encoded data stream to the first connection surface 11 (which is contacted by the tip of the probing device 21). Alternatively, the bias tee could also be integrated into the probing device 21 or the frontend 25, or it can be connected externally.

The bias tee 26 can electrically isolate or decouple the encoded data stream from the power measurement cell. 12. For instance, the bias tee 26 comprises a first port which is connected to the first connection surface 11, a second port which is connected to the encoding unit 14 and a third port which is connected to the power measurement cell 12.

Furthermore, the first connection surface 11 can be connected to the power measurement cell 12 via a filter element. The filter element can be a filter capacitor (and can be a component of the bias tee 26). For instance, the capacitance of the filter element can shield the (DC biased) encoded data stream from the power measurement cell, i.e., prevent that the encoded data stream is fed back to the ADC 13 from the first connection surface 11.

The power measurement cell 12 can comprise a diode D. The ADC 13 can be configured to measure a voltage drop over the diode. The power measurement cell 12 might further comprise a capacitor C and a resistor R.

Thus, the power of the RF signal can be read out by an analog voltage signal which is fed to the ADC 13 and converted into a digital signal. This digital signal can be encoded by the encoding unit 14 and transmitted back to the measurement device 24, e.g. the receiving unit 28, via the bias tee 26. As an alternative to the bias tee 26, the encoded data stream could also be transmitted back to the measurement device 24 via a DC or low frequency connector of a multi-pin probe of the probing device 21.

The signal of the encoded data stream, which is fed back to the receiving unit 28, can be a DC signal or a low frequency signal. In particular, the frequency of this signal is lower than the RF signal frequency to avoid interference between these two signals. The bias tee 26 can be configured to decouple this low frequency/DC signal from the high frequency RF signal.

The receiving unit 28 of the measurement device 24 can comprise a decoder 28 configured to decode the encoded data stream.

For instance, the measurement device 24 comprises an optional digital to analog converter (DAC) which converts the decoded digital signal back into an analog signal, wherein the signal level of this analog signal is measured to determine the power measured by the power measurement cell 12. The measurement device 24 may comprise further ADC stages to further digitalize the received signals, e.g., for feeding them to a processing unit. Alternatively, the measurement device 24 does not comprise the optional DAC, and the encoded signal is decoded and not be converted to an analog signal afterwards.

The power measurement cell 12 can further be powered by electrical energy which is received from the probing device 21 at the first connection surface 11 (e.g., via the bias tee 26 or the low frequency connector). For instance, the power supply of the power sensor 17 is being provided by DC or low frequency connections of the probe of the probing device 21 at the power calibration port (first connection surface 11) which is, e.g., connected to the bias tee 26. The same connection is used for transmission of the measured and modulated (encoded) data.

Thus, the tip of the probing device can be used for transmitting energy for powering the power measurement cell 12 and for transmitting the RF signal used for the power calibration measurements.

Figure 3A:
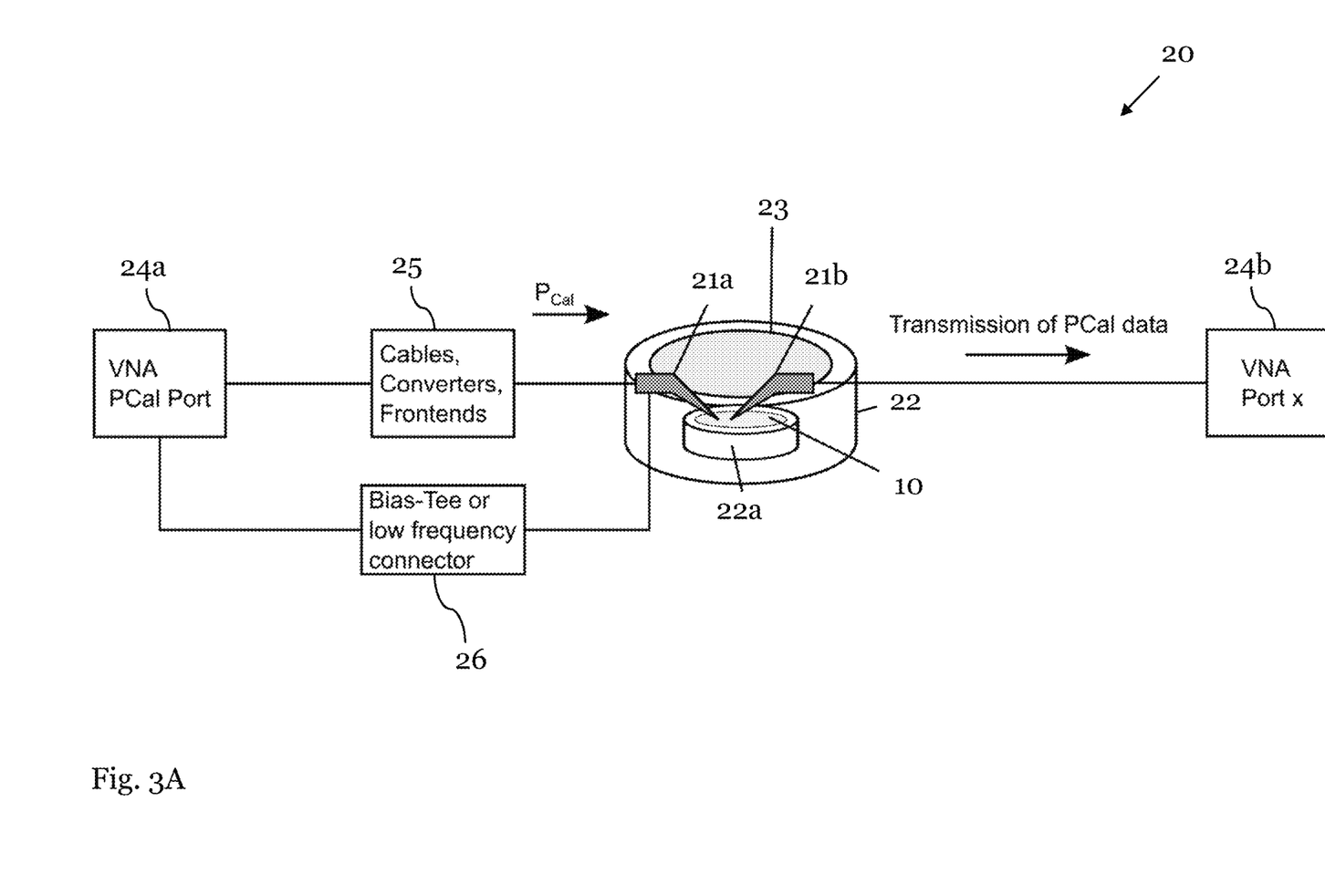
FIGS. 3A-3B show schematic diagrams of a system comprising a power sensor arrangement according to an embodiment.
Figure 3B:
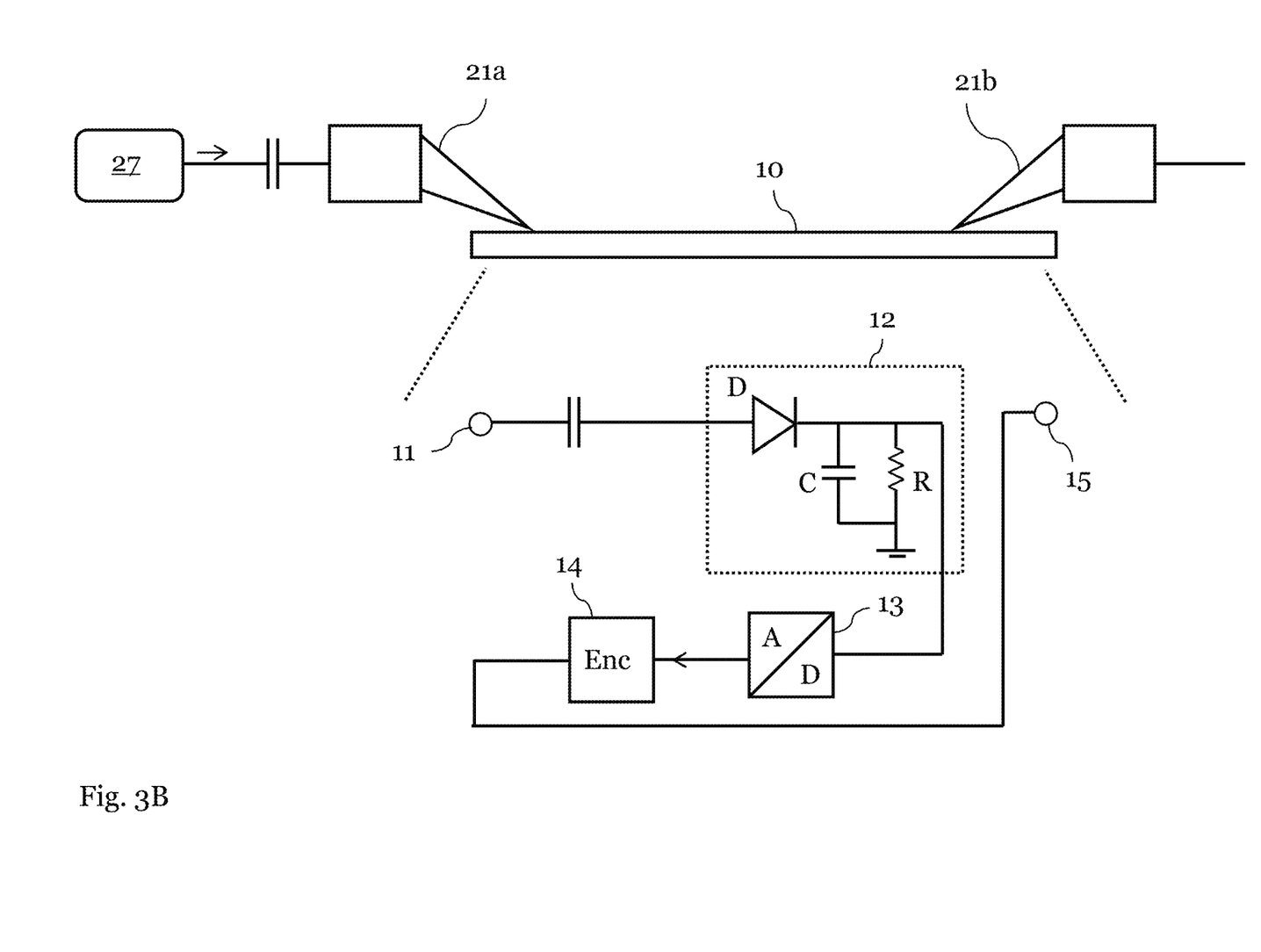

FIGS. 3A-3B show schematic diagrams of a further system 20 comprising the power sensor arrangement 10 according to an embodiment. The power sensor arrangement 10, which is used in the system 10 of FIGS. 3A-3B, uses the second connection surface 15 to forward the encoded data stream (according to option c).

The probing device 21 of the system 20 shown in FIGS. 3A-3B can comprise two probes 21a, 21b. During calibration mode, the chuck 22 is configured to move the power sensor arrangement 10 to establish an electrical connection between a tip of the first probe 21a and the first connection surface 11 and between a tip of the second probe 21b and the second connection surface 15.

The first probe 21a can be connected to a first port 24a of the measurement device 24 and the second probe 21b can be connected to a second port 24b of the measurement device 24. These probes 21a, 21b can also be used to carry out transmission calibration measurements. For instance, during at least some calibration measurements, the measurement device 24 can be configured to forward a calibration signal (e.g., calibration signal $P_{Cal}$) via the first probe 21a to the first connection surface 11 and to receive a transmission signal $T_x$ from the second connection surface 15 via the second probe 21b.

The power sensor arrangement 10 of the system 20 shown in FIGS. 3A and 3B can be configured to use the second connection surface 15 to forward the encoded data stream via the second probe 21b to the second measurement port 24b of the measurement device 24. Therefore, the encoding unit 14 can be electrically connected to the second connection surface 15 as shown in the equivalent circuit diagram of FIG. 3B.

The first port 24a (e.g., a PCal port) of the measurement device can further be used to power the power sensor arrangement 10, in particular the power measurement cell 12, with electrical energy via the bias tee 26 or the low frequency connector.

Figure 4A:
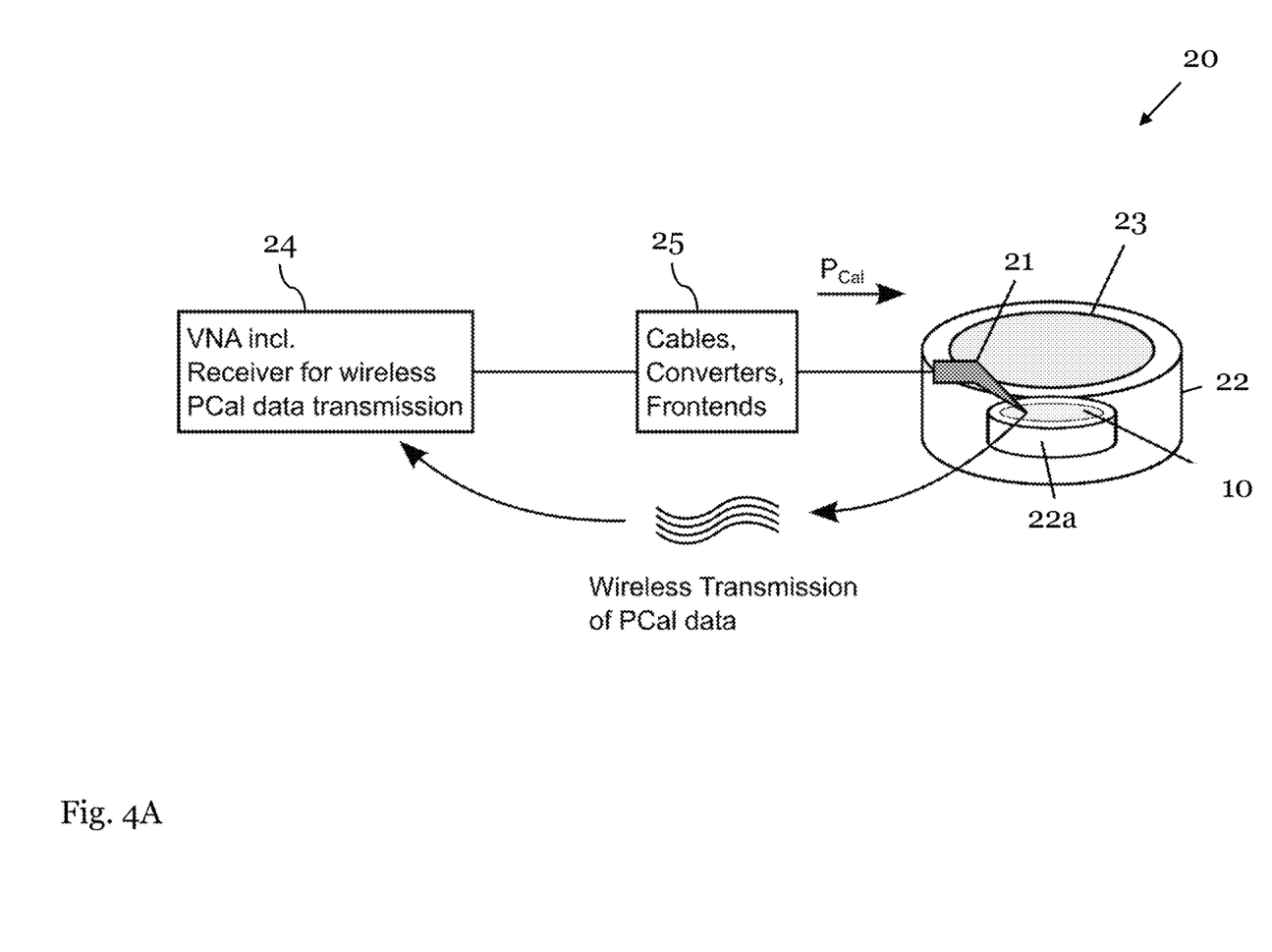
FIGS. 4A-4B show schematic diagrams of a system comprising a power sensor arrangement according to an embodiment.
Figure 4B:
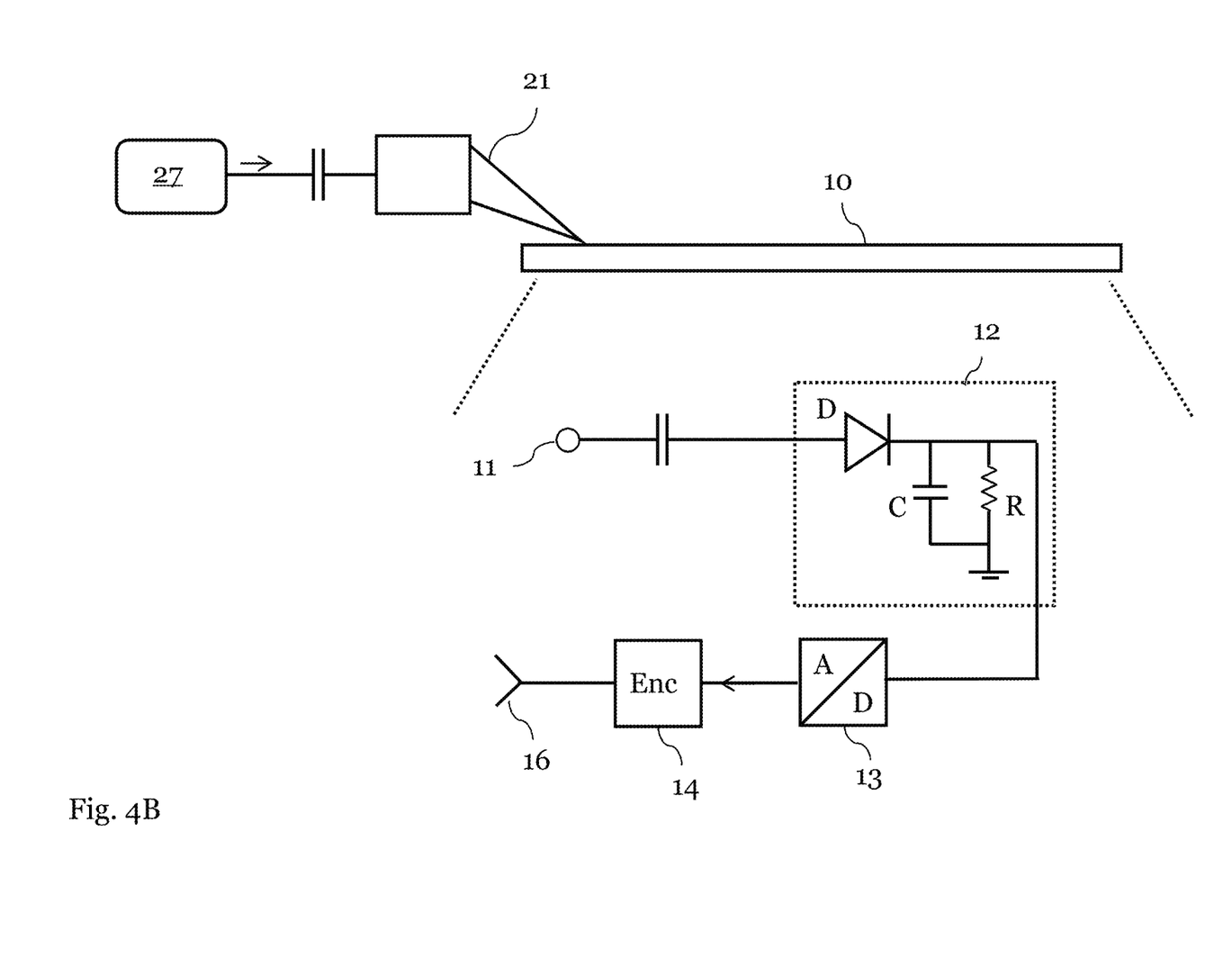

FIGS. 4A-4B show schematic diagrams of a further system 20 comprising the power sensor arrangement 10 according to an embodiment. The power sensor arrangement 10, which is used in the system 10 of FIGS. 4A-4B, comprises the antenna unit 16 to forward the encoded data stream (according to option b).

For instance, during calibration mode, the receiving unit 28 of the measurement device 24 establishes a wireless communication connection with the antenna unit 16 of the power sensor arrangement 10. In this case, the chuck does not have to move in a "calibration position" where a tip of the probing device 21 is in electrical contact with the sensor arrangement 10.

In this example, the power of the RF signal (a-wave) received at the first connection surface 11 can be used to drive the power sensor 17, modulate a transmission signal (encoded data stream) and wirelessly transmit the measurement data back to the measurement device 24.

The antenna unit 16 can be integrated into the substrate 18 of the power sensor arrangement 10 and connected to the encoding unit 14. The receiving unit 28 can comprise a receiving antenna. For instance, the receiving unit 28 is integrated in the measurement device 10 or arranged externally to the measurement device 10 (e.g., connected to the measurement device 10 via a communication connection).

The system 20 in any one of FIGS. 2A-2B, 3A-3B, 4A-4B can further operate in a measurement mode, during which the chuck 22 is configured to move the wafer 23 to establish an electrical connection between the probe tip of the probing device 21 and at least one circuit structure to be tested on the wafer 23 (e.g., to a connection surface of the circuit structure).

For example, during measurement mode (or state), the signal source 27 is configured to adjust the power level of the generated RF signal based on the encoded data stream received via the receiving unit 28 during the calibration mode. This ensures that an RF signal with a precisely defined power is applied to the tip of the probing device 21. In this case, the RF signal can be a measurement signal.

Further, during measurement mode, the measurement device 24 can be configured to correct and/or adapt measurement results (of the circuit structures to be tested) based on the encoded data stream received via the receiving unit. For instance, due to the calibration, a difference between the ideal power level and the actual power level of the RF signal on the tip of the probing device 21 is known. This information can be used in the measurement mode to correct/adjust measurement results with the circuit structures. For instance, in this case, the power of the signal source might not be readjusted.

For instance, the chuck 22 can comprise a support surface for placing the wafer 23 to be measured/tested, and a chuck extension 22a for placing the substrate 18 of the power sensor arrangement 10. In this way, both wafer 23 and the power sensor arrangement 10 can be placed on the chuck at the same time, and do not have to be swapped when carrying out a calibration measurement.

An example application of a calibration with the power sensor arrangement 10 is the following: The power sensor 17 is integrated on a calibration substrate 18 which is used for on-wafer calibrations, such as TRL. The substrate 18 can comprises additional calibration standards (e.g., open, short, match, line, etc.). After performing an S-parameter calibration on the calibration substrate 18 (using the calibration standards) the error terms up to the probe tips of the probing device 21 are known but the absolute power can still be unknown. Therefore, one of the power sensors 17 on the same substrate 18 can be contacted with the probe of the probing device 21 which is connected to a desired port of the measurement device 24 for which the power calibration is required. Having precise knowledge of the exact power on the tip of the probe is important, for accurately measuring if a chip (e.g., an amplifier) works according to its specifications and can be further encased.

All features described above or features shown in the figures can be combined with each other in any advantageous manner within the scope of the disclosure.

The invention claimed is:

1. A power sensor arrangement for on-wafer power calibration comprising at least one power sensor which comprises:
   a first connection surface which is arranged to receive a probe tip of a probing device;
   a power measurement cell which is electrically connected to the first connection surface, wherein the power measurement cell is configured to measure a power level of an radio frequency (RF) signal applied to the first connection surface;
   an analog-to-digital converter (ADC) which is configured to digitalize an output signal of the power measurement cell to generate a digitalized data stream; and
   an encoding unit which is configured to encode the digitalized data stream; wherein the encoding unit is configured to output the encoded data stream to:
   the first connection surface,
   a second connection surface of the at least one power sensor, or
   an antenna unit of the power sensor arrangement
   for forwarding the encoded data stream.

2. The power sensor arrangement of claim 1,
   wherein the power measurement cell comprises a diode, and wherein the ADC is configured to measure a voltage at the diode.

3. The power sensor arrangement of claim 2,
   wherein the diode is configured to transform the power level of the RF signal into a corresponding voltage signal, wherein the corresponding voltage signal is fed to the ADC.

4. The power sensor arrangement of claim 1,
   wherein the at least one power sensor comprises a bias tee which is configured to apply the encoded data stream to the first connection port and to electrically isolate or decouple the encoded data stream from the power measurement cell.

5. The power sensor arrangement of claim 1,
wherein the first connection surface is connected to the power measurement cell via a filter element.

6. The power sensor arrangement of claim 1,
wherein the first connection surface, the antenna unit or the second connection surface are configured to forward the encoded data stream to a receiving unit of a measurement device;
wherein a communication between the at least one power sensor and the receiving unit is a bidirectional or an unidirectional communication.

7. The power sensor arrangement of claim 1,
wherein the antenna unit is arranged on the same substrate as the at least one power sensor.

8. The power sensor arrangement of claim 1,
wherein the antenna unit comprises an antenna element and a transmitter, wherein the transmitter is configured to receive the encoded data stream and to forward the encoded data stream to the antenna element.

9. The power sensor arrangement of claim 8,
wherein the transmitter is configured to power the antenna element with less than 100 mW or with less than 10 mW.

10. The power sensor arrangement of claim 1,
wherein the power measurement cell is powered by electrical energy received via the first connection surface.

11. The power sensor arrangement of claim 1, comprising:
a plurality of the power sensors, wherein the plurality of the power sensors is arranged on the same substrate or on different substrates.

12. The power sensor arrangement of claim 1,
wherein only one of the plurality of the power sensors is usable at the same time.

13. A system comprising:
the power sensor arrangement of claim 1;
a measurement device which comprises a signal source configured to generate the RF signal and a receiving unit configured to receive the digitalized data stream from the power sensor arrangement;
a chuck which is design to accommodate the power sensor arrangement and/or a wafer with circuit structures to be tested; and
the probing device, wherein the probing device is electrically connected to the signal source.

14. The system of claim 13,
wherein the system is operable in a calibration mode during which:
the chuck is configured to move the power sensor arrangement to establish an electrical connection between at least one probe tip of the probing device and the first and/or the second connection surface of the at least one power sensor; and/or
the receiving unit is configured to establish a wireless communication connection with the antenna unit of the power sensor arrangement.

15. The system of claim 14,
wherein the system is operable in a measurement mode during which the chuck is configured to move the wafer to establish an electrical connection between the probe tip of the probing device and at least one circuit structure to be tested.

16. The system of claim 15,
wherein, in the measurement mode, the signal source is configured to adjust a power level of the generated RF signal based on data in the encoded data stream received at the receiving unit during calibration mode.

17. The system of claim 15,
wherein, in the measurement mode, the measurement device is configured to correct and/or adapt results of measurements of the circuit structures on the wafer based on data in the encoded data stream received at the receiving unit during calibration mode.

\* \* \* \* \*